(12) United States Patent  
Simmons et al.

(10) Patent No.: US 9,165,742 B1  
(45) Date of Patent: Oct. 20, 2015

(54) INSPECTION SITE PREPARATION

(71) Applicant: KLA-Tencor Corporation, Milpitas, CA (US)

(72) Inventors: Richard Simmons, Los Altos, CA (US); Douglas Masnaghetti, San Jose, CA (US); Mark McCord, Los Gatos, CA (US); Fred E Stanke, San Jose, CA (US); Scott Young, Soquel, CA (US); Christopher Sears, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/627,940

(22) Filed: Feb. 20, 2015

Related U.S. Application Data

(60) Provisional application No. 62/062,642, filed on Oct. 10, 2014.

(51) Int. Cl.
| | |
|---|---|
| *H01J 37/26* | (2006.01) |
| *H01J 27/00* | (2006.01) |
| *H01J 37/06* | (2006.01) |
| *H01J 37/28* | (2006.01) |

(52) U.S. Cl.  
CPC *H01J 37/06* (2013.01); *H01J 37/28* (2013.01)

(58) Field of Classification Search  
CPC .. H01J 2237/004; H01J 37/28; G01N 21/956; G01N 23/225  
USPC ............. 250/310, 306, 307, 311, 396 R, 397, 250/423 R, 424, 492.3  
See application file for complete search history.

(56) References Cited

U.S. PATENT DOCUMENTS

| | | | |
|---|---|---|---|
| 4,420,686 | A | 12/1983 | Onoguchi et al. |
| 5,006,795 | A | 4/1991 | Yoshizawa et al. |
| 6,066,849 | A | 5/2000 | Masnaghetti et al. |
| 6,211,518 | B1 | 4/2001 | Richardson et al. |
| 6,504,393 | B1 | 1/2003 | Lo et al. |
| 6,566,885 | B1 * | 5/2003 | Pinto et al. .................... 324/501 |
| 6,570,154 | B1 | 5/2003 | Masnaghetti et al. |

(Continued)

FOREIGN PATENT DOCUMENTS

| | | |
|---|---|---|
| WO | 9923684 A1 | 5/1999 |
| WO | 0072355 A | 11/2000 |
| WO | 2011016208 A1 | 2/2011 |

OTHER PUBLICATIONS

U.S. Appl. No. 62/062,642 to Douglas Masnaghetti et al. filed Oct. 10, 2014.

*Primary Examiner* — Nikita Wells  
(74) *Attorney, Agent, or Firm* — Joshua D. Isenberg; JDI Patent

(57) ABSTRACT

Embodiments of the present disclosure are directed to an electron beam imaging/inspection apparatus having an electron source device to direct flood electrons on a sample immediately before image acquisition or inspection. The apparatus comprises a first device configured to charge a sample in a first mode, wherein the first device includes an electron source configured to provide a flood beam of charged particles to a first area of the sample. The apparatus also comprises a second device configured to generate a primary beam of electrons and characterize an interaction between the primary beam and a second area of the sample within the first area in a second mode. The apparatus is configured to switch from the first mode to the second mode less than 1 second.

33 Claims, 10 Drawing Sheets

(56) References Cited

U.S. PATENT DOCUMENTS

| | | |
|---|---|---|
| 6,610,980 B2 | 8/2003 | Veneklasen et al. |
| 6,627,884 B2 * | 9/2003 | McCord et al. ............... 850/18 |
| 6,797,955 B1 | 9/2004 | Adler et al. |
| 6,828,571 B1 | 12/2004 | McCord et al. |
| 7,019,292 B1 | 3/2006 | Fan et al. |
| 7,253,410 B1 * | 8/2007 | Bertsche et al. ............ 250/310 |
| 7,276,693 B2 | 10/2007 | Koyama et al. |
| 7,294,590 B2 | 11/2007 | Wang et al. |
| 7,335,879 B2 | 2/2008 | Chen |
| 7,488,938 B1 | 2/2009 | Gubbens et al. |
| 7,488,952 B2 | 2/2009 | Ward et al. |
| 7,501,625 B2 | 3/2009 | Koyama et al. |
| 7,528,614 B2 | 5/2009 | Bullock |
| 7,880,143 B2 * | 2/2011 | Tanimoto et al. ............ 250/310 |
| 7,973,283 B2 * | 7/2011 | Wang et al. ................. 250/311 |
| 8,071,722 B2 | 12/2011 | Kaplan et al. |
| 8,110,814 B2 | 2/2012 | Ward et al. |
| 8,168,948 B2 | 5/2012 | Botman et al. |
| 8,207,512 B2 | 6/2012 | Shishido et al. |
| 8,217,349 B2 | 7/2012 | Kuan et al. |
| 8,294,125 B2 | 10/2012 | Han et al. |
| 8,404,212 B2 | 3/2013 | Norton et al. |
| 8,536,540 B2 | 9/2013 | Suzuki et al. |
| 8,584,352 B2 | 11/2013 | Narahashi et al. |
| 8,815,793 B2 | 8/2014 | Messersmith et al. |
| 2002/0149381 A1 | 10/2002 | Lo et al. |
| 2005/0205800 A1 * | 9/2005 | Barnard et al. ............ 250/423 R |
| 2012/0153145 A1 | 6/2012 | Cheng et al. |

\* cited by examiner

INSPECTION SITE PREPARATION

CLAIM OF PRIORITY BENEFIT

This application claims the priority benefit of commonly-assigned, co-pending U.S. provisional patent application No. 62/062,642, filed Oct. 10, 2014, entitled "Inspection Site Preparation", the entire disclosures of which are incorporated herein by reference.

CROSS-REFERENCE

U.S. Pat. Nos. 8,748,845; 8,541,060; 8,329,138; 8,110,814; 7,928,384; 8,013,311; 7,335,879; 6,633,174; 6,569,654; and 6,433,561 are all related to the present disclosure. All of these patents are incorporated herein by reference in their entirety.

FIELD OF THE INVENTION

Aspects of the present disclosure generally relate to imaging and inspection systems, and more particularly to apparatus and methods for charge control on a sample and optimization of image quality in imaging and inspection systems.

BACKGROUND OF THE INVENTION

Electron beam imaging requires an even charge distribution on a sample area in order to properly represent image contrast. A flood gun is used to neutralize initial charges which are carried over upon transfer of the sample to the imaging system by flooding the sample area with energetic electrons. Such flooding also equalizes charges that build up on the sample during imaging from the inspection beam. In some applications, e.g., semiconductor wafer imaging with a scanning electron microscope (SEM), the flood gun is used only during the acquisition of swath images. Frame imaging uses the electron gun to do both flooding and inspection.

The flood gun is very similar to the electron gun used in the electron beam imaging system. The main difference is that instead of emitting a focused beam concentrated on a small area (e.g., a few square microns or less), the flood gun sprays a wide beam of electrons, over a much larger area, e.g., about 1 square centimeter. The electrons from the flood gun approach perpendicular to the sample surface, flooding the sample area. Typical flood gun hardware includes a high current filament which heats a metal tip, causing emission of electrons toward an extractor electrode. The extractor controls the number of electrons which are emitted towards the wafer and can be used to turn on or turn off (blank) the beam. A Wehnelt electrode positioned close to the wafer surface creates an electric field to control the number of electrons which stay on the wafer. During inspection, the wafer floats at a potential controlled by a power supply.

Flooding and swathing typically commonly done sequentially but may be done simultaneously. Flooding and swathing generally operate on different areas of the sample. In swathing, the sample is imaged by rastering the primary beam in one direction (e.g., the X-direction) while the sample translates in a perpendicular direction (e.g., the Y-direction). By way of example, during a wafer inspection, a stage moves the sample such that an area of the sample is flooded before it is inspected. Flooding is typically either on or off for the entire duration of a swath. Because flooding covers a significantly larger area than a swath, flooding may be turned off, e.g., at least every other swath. To prolong the life of the flood gun, the flood gun beam may be blanked, e.g., by applying a suitable voltage to the extractor, when not needed.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

SUMMARY

Figure 1:
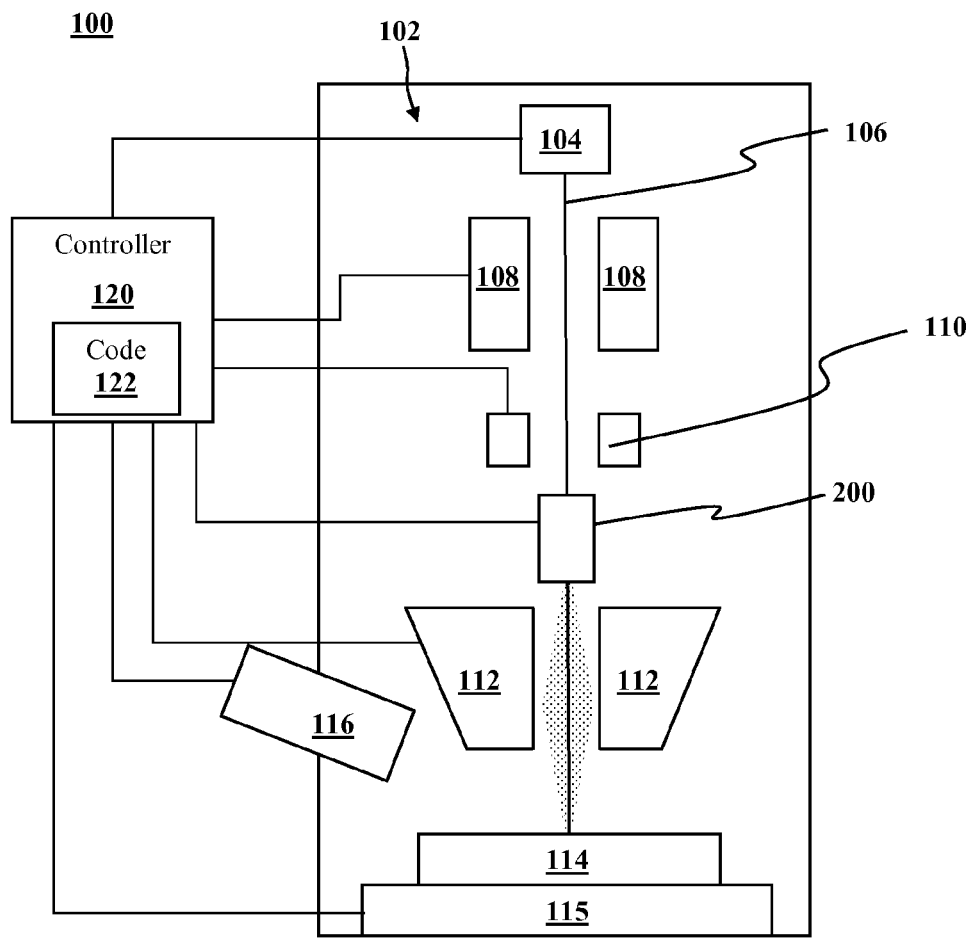
FIG. 1 is a schematic diagram of an electron beam imaging apparatus according to an aspect of the present disclosure.

According to aspects of the present disclosure, an electron beam imaging/inspection apparatus has an electron source device to direct flood electrons on a sample immediately before image acquisition or inspection. The apparatus comprises a first device configured to flood a portion of a sample with charge in a first mode. The first device includes an electron source configured to provide a flood beam of charged particles to a first area of the sample. The apparatus also comprises a second device configured to generate a primary beam of electrons and characterize an interaction between the primary beam and a second area of the sample within the first area in a second mode. The apparatus is configured to switch from the first mode to the second mode in less than 1 second.

In some implementations, the first device is a flood gun.

In some implementations, the second device is a scanning electron microscope (SEM), a critical dimension scanning electron microscope (CD-SEM), e-beam inspection, e-beam review or e-beam lithography system.

In some implementation, the electron source for the first device includes an initiating radiation source, a micro-channel plate and an extractor, the initiating radiation source being configured to initiate generation of charged particles by the micro-channel plate, and the extractor being configured to extract the charged particles and form the flood beam.

In some implementation, the first device further comprises a blanking electrode configured to turn off the first device.

In some implementation, at least a portion of the flood beam is coaxial with the primary beam.

In some implementation, the first device is configured to provide the flood beam coaxially with the primary beam.

Another aspect of the present disclosure provides a method comprising charging a first area of a sample as a first mode with a flood beam of charged particles by a first device, wherein the first device includes an electron source; imaging a second area of the sample within the first area as a second mode with a primary beam of electrons by a second device; and switching from the first mode to the second mode in less than 1 second, more preferably, less than 0.1 second, still more preferably less than 0.01 second, and even more preferably less than 1 millisecond. It is desirable to switch rapidly between flood and image to minimize charge dissipation due to fast time constant discharge mechanisms.

Another aspect of the present disclosure provides an apparatus comprising an initiating radiation source; a micro-channel plate, wherein the initiating radiation source is configured to initiate generation of charged particles by the micro-channel plate; and an extractor configured to extract the charged particles and form a beam of the charged particles.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the present disclosure. Accordingly, the exemplary embodiments of the invention described below are set forth without any loss of generality to, and without imposing limitations upon, the claimed invention.

Introduction

In a conventional scanning electron microscopy, a beam of electrons is scanned over a sample (e.g., a semiconductor wafer). Multiple raster scans are typically performed over a small area of the sample. The beam of electrons either interact with the sample and cause an emission of secondary electrons or bounce off the sample as backscattered electrons. The secondary electrons and/or backscattered electrons are then detected by a detector that is coupled with a computer system. The computer system generates an image that is stored and/or displayed on the computer system.

Typically a certain amount of charge is required to provide a satisfactory image. This quantity of charge helps bring out contrast in features of the sample. On a sample made of substantially insulative material (e.g., a semiconductor or semiconductor oxide or nitride), performing one or more scans over a small area may cause the sample to accumulate excess positive or negative charge in the image area relative to the rest of the sample. Excess positive charge may form a significant potential barrier to secondary electrons and result in fewer secondary electrons reaching the detector. Thus, the image area is likely to appear darker. On the other hand, excess negative charge may increase the collection of secondary electrons causing the image to saturate.

Excess charge remaining from a previous viewing or processing operation may therefore cause distortion. One solution used in SEM devices is to provide a flood gun in a vacuum chamber close to the imaging column and flood the sample with charged particles from the flood gun at a time separate from the inspection. Thus, flooding equalizes the charge appearing across the sample, thus enhancing the voltage contrast images.

Specifically, the flood gun may be a thermionic electron gun that uses one or more tungsten filaments as an electron source. In the thermionic electron gun, electrons are emitted from a heated filament and then accelerated towards an anode. A thermionic electron gun can deliver a total electron current of up to 100 μA. Another way to get emission is to decrease the "work function (energy barrier)" that limits emission. Materials with lower work functions emit at lower temperatures (e.g., Lanthanum Hexaboride ($LaB_6$)). Unfortunately, $LaB_6$ emitters cannot be used in certain applications because they tend to produce Boron trioxide, an insulator, which gets deposited in places in the chamber where it is not desired. Another common type of electron source in use today is a field emission sources. This type of source relies on a strong electric field at one or more emitters to produce emission at much lower temperature than a thermionic emission source. Typical field emission sources have one or more electrically conducting sharp points located proximate an extractor. A voltage between the sharp point(s) and the extractor produces a large electric field in the vicinity of the point due to the small radius of the point. As a result of the large electric field, electrons can quantum mechanically tunnel from the conduction band into the vacuum thereby producing electron emission.

In a common SEM operation, when a charging contact layer is formed as a result of exposure of the sample to the imaging beam, a stage moves the sample from under the SEM and takes it to a separate location under the flood gun. The flood gun irradiates the sample for a few minutes, e.g., up to 20 minutes. After flooding the wafer, the stage moves to the SEM and begins imaging.

One drawback to this flooding procedure is the long times involved in flooding, moving the sample to and from the SEM and long image acquisition times. Specifically, the stage including the entire sample has to be moved to the area of the flood gun. In order to accomplish the flooding, inspection with the SEM must stop to permit movement of the sample to the area of the flood gun. This dramatically increases the overall time required for the inspection since movement and flooding of the sample may take 20 minutes or more to complete. This produces an equally dramatic decrease in the throughput for the inspection process. Typically a full inspection of a sample will require hundreds of scan lines across the sample and the dissipation of charge may be required after only a few scan lines have been completed. The total time required for a sample to be inspected therefore is the sum of the separate intervals for charge dissipation (or pre-charging) and inspection. In addition, if imaging is performed for a long time, images acquired at the end of the run may be visibly worse than those from the beginning.

Consequently, what is needed is a method or apparatus that facilitates charge control with a high current density electron dose on a sample without requiring removal of the sample from the inspection beam or otherwise requiring inspection beam operation to be interrupted. Aspects of the present disclosure include an electron beam imaging apparatus (e.g., SEM) having an electron source device (e.g., flood gun) to direct flood electrons along the primary axis of an inspection/imaging beam in the imaging apparatus. Aspects of the present disclosure allow a sample to be charged in situ immediately before image acquisition.

Apparatus

Embodiments of the present disclosure may be implemented within any suitable measurement/inspection device that directs charged particles towards a sample and then detects emitted particles from the sample. FIG. 1 shows a schematic diagram of an apparatus according to one aspect of the present disclosure. By way of example and not by way of limitation, the apparatus 100 may be a single-beam or multi-beam defect review scanning electron microscope (SEM), a single beam or multi-beam defect inspection SEM, a single-beam or multi-beam critical dimension scanning electron microscope (CD-SEM). In other examples, the apparatus 100 may be a single-beam or multi-beam E-beam lithography system.

The apparatus 100 includes an imaging/inspection device and a flood gun integrated with the imaging/inspection device as shown in FIG. 1. The imaging/inspection device includes a primary column 102. The column 102 may include an electron gun 104 that is the source of electrons for the primary (imaging/inspection) beam 106. Condensing lenses 108 condense the beam 106 into a tighter cross-section and higher density. The beam 106 is controllably deflected using scanning coils or scan plates 110 so as to scan the beam across the desired area. An objective lens 112 focuses the beam onto a sample 114, which may be mounted to a stage 115, which may be configured to retain, translate and/or rotate the sample.

By way of example and not by way of limitation, the sample 114 may be a wafer, reticle or thin film head substrate. In addition, a detector 116 is arranged to detect and collect secondary electrons (and/or backscattered electrons) emitted from the sample for further processing and analysis. Optionally, an energy filter (not shown) may be included to protect the detector 116 during flooding. In one embodiment, the energy filter may be applied using a negatively-biased electrostatic grid in front of a detector. In another embodiment, the energy filter is applied using an omega filter in front of a detector. In another embodiment, the energy filter may be applied using an electrostatic or magnetic deflector in front of a detector. In yet another embodiment, a voltage may be applied to the sample 114 to control the landing energy of the electrons in the beam 106. Additionally, a flood gun 200 is incorporated into the column 102 and is configured to provide a flood beam coaxially with the primary beam 106 as shown in FIG. 1.

The primary electron gun 104, condensing lenses 108, scanning coils 110, objective lens 112, stage 115, detector 116, and flood gun 200 may be operably coupled to a controller 120, which may include power supplies configured to provide voltages and or currents to these elements in response to hardware or software instructions. The controller 120 may include a special purpose computer or a general purpose computer configured to operate as a special purpose computer upon execution of code instructions 122, which may be stored in a computer memory or other non-transitory computer readable medium.

According to aspects of the present disclosure, the apparatus 100 may be used to implement charge control during sample inspection according to an inventive method. According to the method a first area of the sample 114 within a first region of the sample may be imaged with the primary beam 106 of electrons from the primary column 102. The first area of the sample may then be charged with a beam of charged particles from the flood gun 200. A second area of the sample within the first area may then be imaged with the primary beam of electrons from the primary column 102. The configuration of the apparatus 100 allows a time between ending imaging of the first area and beginning imaging of the second area to be less than one second.

Method

Aspects of the present disclosure include implementations in which flooding and swathing occur simultaneously, but on different areas of the sample. In swathing, the sample is imaged by rastering the primary beam 106 in one direction (e.g., the X-direction) while the sample 114 translates in a perpendicular direction (e.g., the Y-direction) and a swath image is taken across a width of the sample. By way of example, during a wafer inspection, the stage 115 may move the sample 114 while the flood gun 200 provides a flood beam such that an area of the sample being swathed is flooded before it is inspected with the primary beam. To prolong the life of the flood gun, the flood gun beam may be blanked, e.g., by applying a suitable voltage to the extractor, when not needed.

Alternative Implementations

Figure 2:
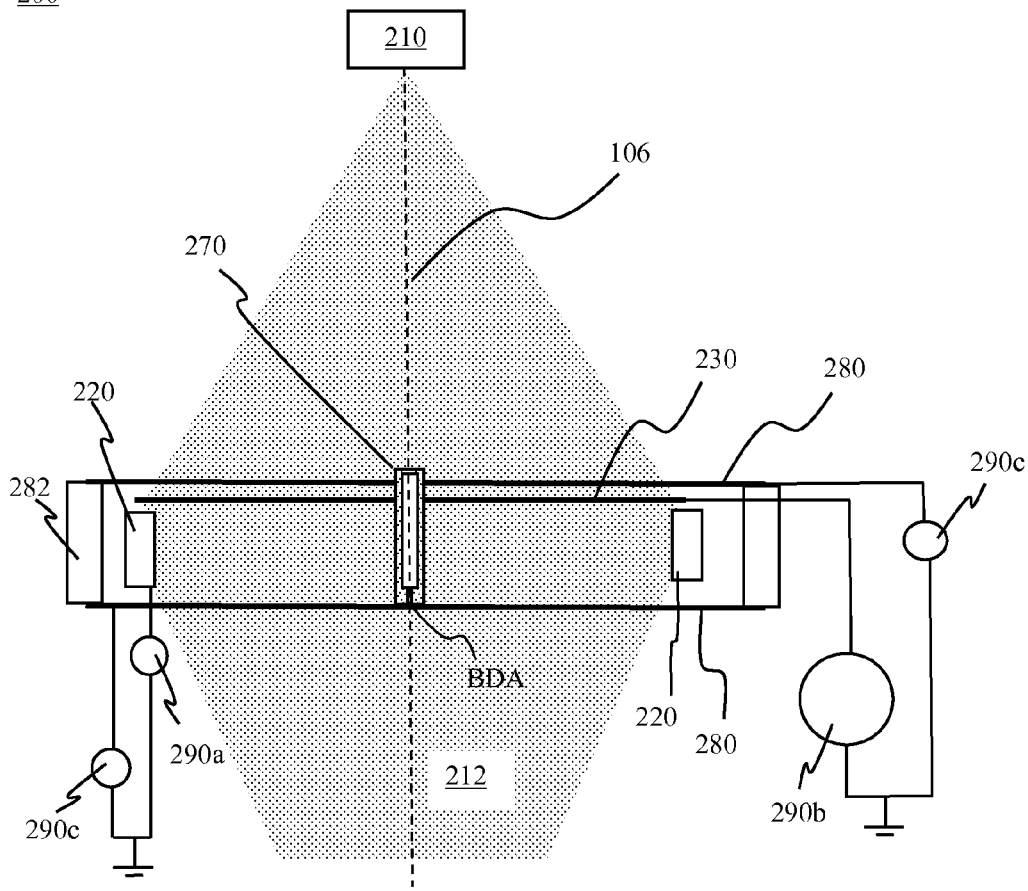
FIG. 2 is a schematic diagram of a flood gun portion of an electron beam imaging apparatus according to an aspect of the present disclosure.

Aspects of the present disclosure are not limited to implementations involving the apparatus 100 of FIG. 1. Several alternative configurations for such an apparatus are possible. FIG. 2 is a schematic diagram of a flood gun that may be incorporated into an apparatus of FIG. 1. Specifically, the flood gun 200 includes an electron source 210 for generating flood electrons 212. By way of example and not by way of limitation, the electron source 210 may be a thermionic source (e.g., tungsten, barium oxide, lanthanum hexaboride or any other dispenser cathodes), a field emission source (e.g., Schottky emitters, conventional cold-cathode or carbon nanotube array) or photon-emission source (e.g., micro-channel plate and nude dynode chain). In another example, the primary beam of electrons may be used as the electron source 210 after defocusing the beam 106. It should be noted that the electron source 210 may be configured to switch on or off rapidly by use of, e.g., high speed voltage supplies. For field emission type sources, other ways of switching the source 210 on and off include biasing the source (e.g., a CNT array) to near emission then photo stimulating electron emission with photons from, e.g., laser, LED, UV, DUV, VUV, or other light source. In addition, lens 220 coupled to voltage supplies 290a focuses the flood electrons 212 and set a spot size for down-stream optics of the primary beam 106. The flood gun 200 also includes a blanking mesh 230 coupled to voltage supplies 290b for disabling the flood gun 200 when needed. For example, a certain voltage value (e.g., −10 volts) with respect to the electron source 210 may be applied to the blanking mesh 230 to thereby inhibit the flood beam from reaching the sample. As shown in FIG. 2, the primary beam may be shielded from the flood high voltage by a metal tube 270 having a narrow (e.g., 10 to 30 micron diameter) beam defining aperture BDA through which the primary beam 106 can pass. Shield meshes 280 coupled to voltage supplies 290c may also be included in the flood gun for protecting the primary beam 106 from the flood high voltage.

An apparatus according to the above embodiments of the present disclosure may provide a large area, high density electron flood on the sample just moments before acquiring image data from any location within the flood area. Specifically, a sample 114 is positioned on a stage (not shown) to allow the primary beam 106 and the flood beam 212 to move over the sample. In other embodiments, the two beams remain stationary while the stage moves the sample underneath them. The apparatus may begin operation in a flood mode. In this mode, the electron source 210 of the flood gun 200 produces a flood beam of charged particles (i.e., the flood electrons). The flood beam charges the surface of the flood area to a certain potential while the stage settles. It is noted that the landing energy of the flood beam of charged particles may be set to any value. In some implementation, the landing energy may be set low for charge cancellation.

A voltage may be applied to the sample 114 to control the landing energy of the electrons from the flood gun 200. The landing energy of the flood electrons may vary over any suitable range. For example, in some implementations, the landing energy may be set to be the same as that of the primary beam 106. Alternatively, the landing energy of the flood beam may be substantially different from that of the primary beam. For example, in some implementations the landing energy may be set very high to charge certain features on the sample, e.g., buried features, for voltage contrast (VC) mapping. This allows for easier imaging of buried features by mapping the electric field contrast of the sample 114 after charging by the flood gun 200. In one embodiment, the flood gun 200 may deliver a total electron current of few µA to few mA into a flood area of 1 mm$^2$ to 100 mm$^2$ on the sample by pulsing the electron source for about 1 µs to about 1 ms. The duration of the flood time is determined by the desired surface charge density deposited and how fast the flood beam may be switched on and off. The amount of charge deposited may be determined by the surface potential developed during flooding. Therefore any suitable mechanism for obtaining a surface charge value of a portion of the sample may be utilized. By way of example and not by way of limitation, an electrostatic voltmeter or Kelvin probe may be used.

After flooding, the apparatus is switched to the imaging mode and image acquisition begins immediately anywhere in the flood area. According to aspects of the present disclosure, it can take less than 1 second from the end of an image acquisition to start and complete the flood mode and switch back to the start of a subsequent image mode. More preferably, this can be done in less than 0.1 second, still more preferably in less than 0.01 second, and even more preferably in less than 1 millisecond. This switch time depends partly on the flood time, which preferably takes about 1 µs to 1 ms, and partly on the settling time of the imaging system following the switch from flood to imaging mode. In some modes of operation, flooding may take place in conjunction with movement of the sample 114 by the stage 115 between image acquisition operations. Stage movement may take less than 200 milliseconds and the flood gun 200 may be activated, e.g., during the last few milliseconds of movement.

Image acquisition may take longer than flooding, e.g., from about 0.2 seconds to about 1 second. During operation in the imaging mode, the primary beam from the imaging/inspection device strikes an imaging area within the flood area and causes the emission of secondary electrons or the release of backscattered electrons from the image area. The secondary electrons (and/or the backscattered electrons) are then detected by the detector 116 for further process and analysis. The primary beam may move to another image area within the flood area for image acquisition. Once image acquisition in the flood area is done, the stage moves to next location of interest. The apparatus then switches to the flood mode and the process may start over again.

Figure 3:
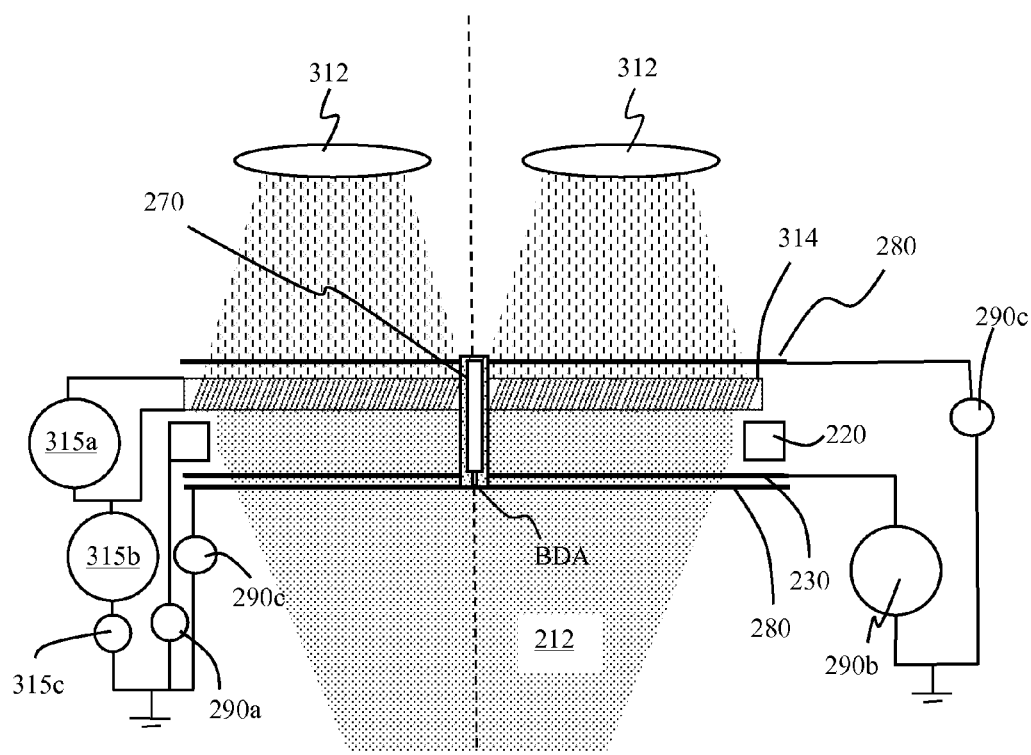
FIG. 3 is a schematic diagram of a flood gun portion of an electron beam imaging apparatus according to an aspect of the present disclosure.
Figure 4:
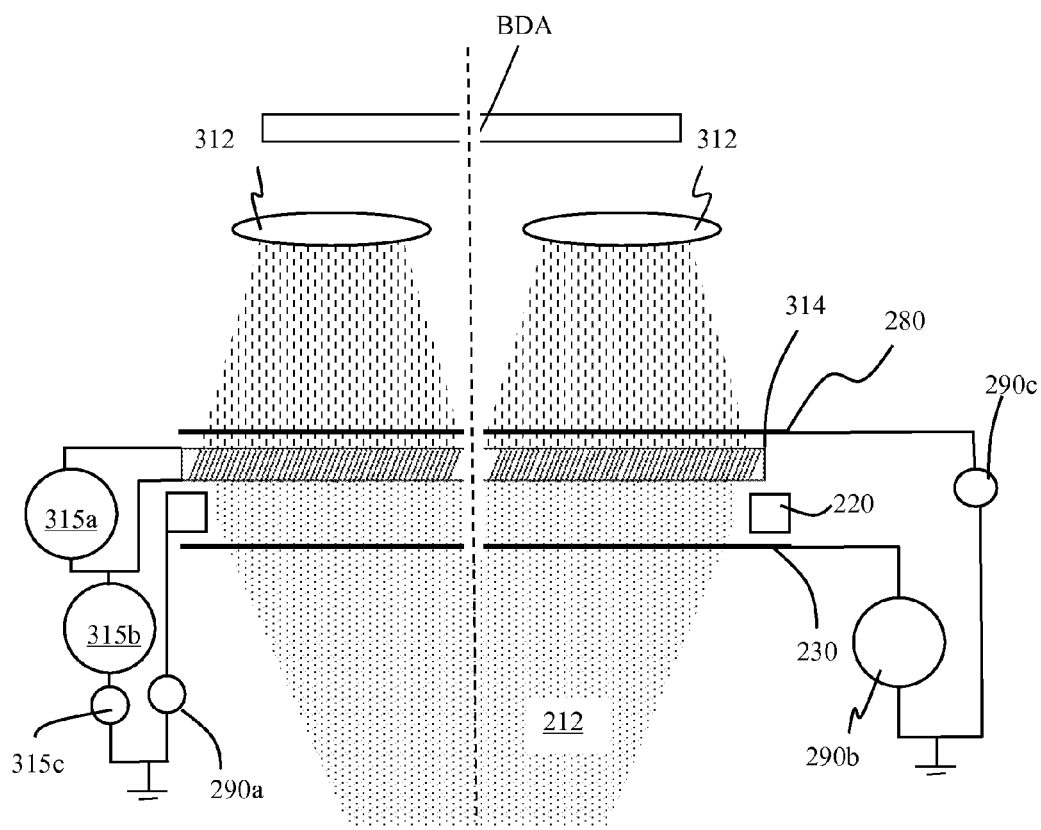
FIG. 4 is a schematic diagram of a flood gun portion of an electron beam imaging apparatus according to an aspect of the present disclosure.

FIGS. 3 and 4 are schematic diagrams of a flood gun using a micro-channel plate as electron source according to an aspect of the present disclosure. For simplicity, identical reference numbers are used to identify components in FIGS. 3 and 4 which are identical to the components in FIG. 2. The description of similar or identical elements is not repeated.

The electron source of flood gun 300 includes an initiating radiation source 312, a micro-channel plate (MCP) 314 and an extractor grid (not shown). The initiating radiation source is configured to initiate generation of charged particles by the MCP plate by supplying radiation that to the MCP 314 that initiates emission of electrons, e.g., by photoemission. The initiating radiation source 312 may be a light source of appropriate wavelength for the photo cathode of the MCP. By way of example and not by way of limitation, the initiation radiation source 312 includes an ultraviolet light emitting diode (LED) or a laser. The secondary electrons from the interaction between the radiation and the MCP are then extracted by the extractor grid. A condenser electrode (not shown) may be included to focus the charged particles extracted by the extractor grid and thereby forming a flood beam of charged particles. The MCP 314 can be turned on and off rapidly switching the initiating radiation source on and off. Alternatively, this may be accomplished by high speed voltage supplies 315a-c while the initiating radiation source 312 is turned on. It is noted that the flood current is adjustable with the MCP gain. In some embodiments, there are a stack of MCPs for additional gains. FIG. 4 is similar to FIG. 3, except for the location of the beam-defining aperture (BDA) for the primary beam. In FIG. 3, the BDA is provided between the MCP 314 and the sample. In FIG. 4, the MCP 314 is provided between the BDA and the sample. In FIG. 4 the high voltage applied to the flood gun to accelerate the flood electrons may be shut down when the flood gun is not in operation. Doing so avoids the need for a shield mesh to shield the primary beam.

Figure 5:
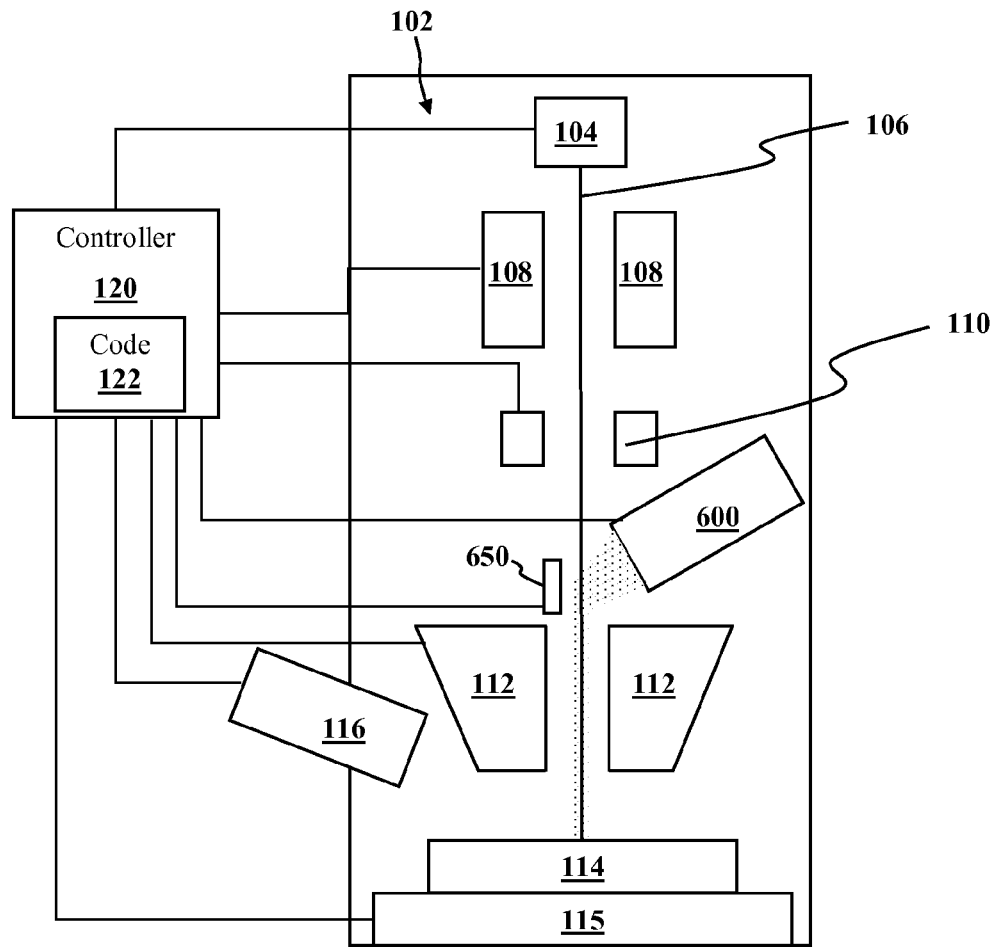
FIG. 5 is a schematic diagram of an electron beam imaging apparatus according to an aspect of the present disclosure.
Figure 6:
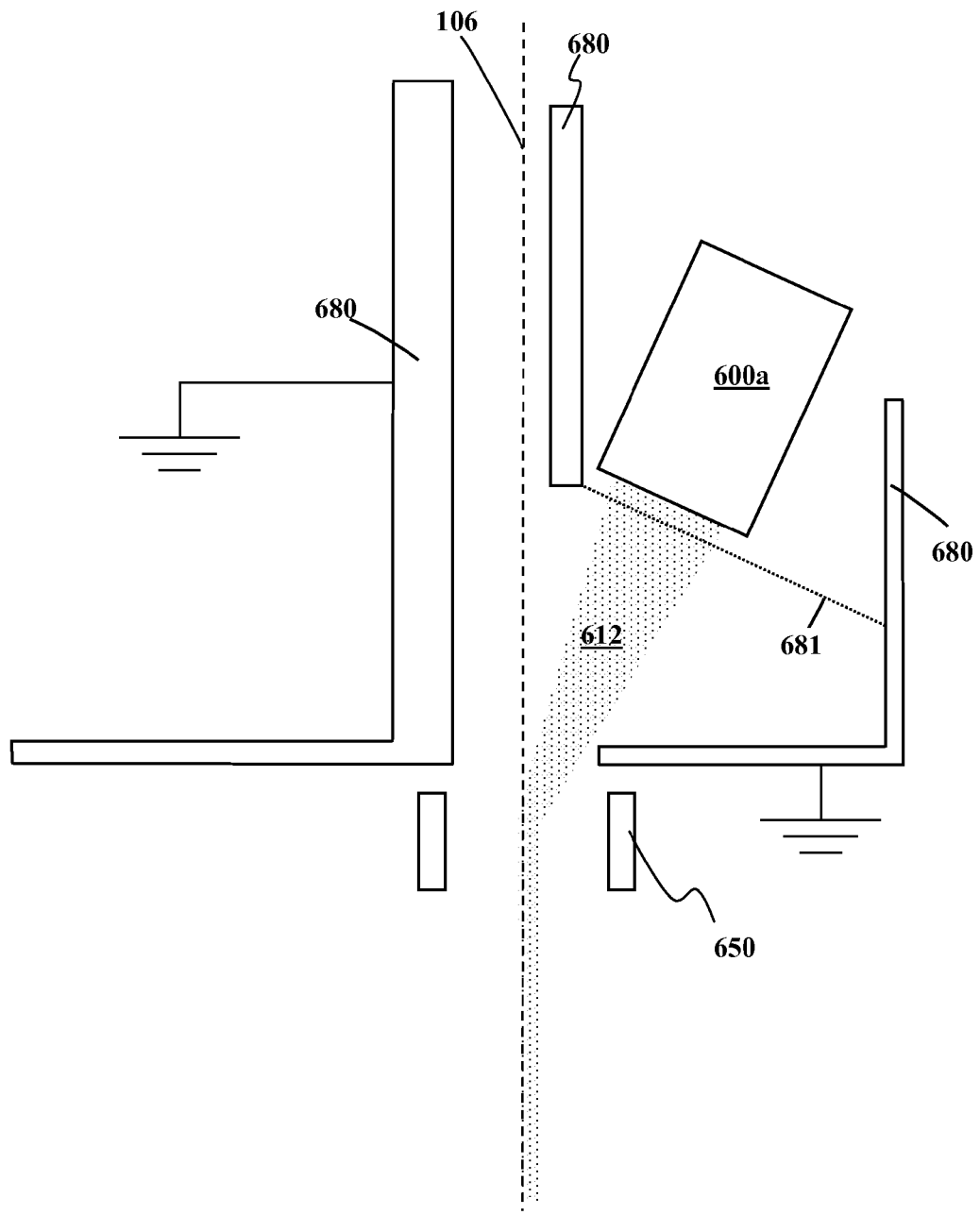
FIG. 6 is a schematic diagram of a flood gun portion of an electron beam imaging apparatus according to an aspect of the present disclosure.
Figure 7:
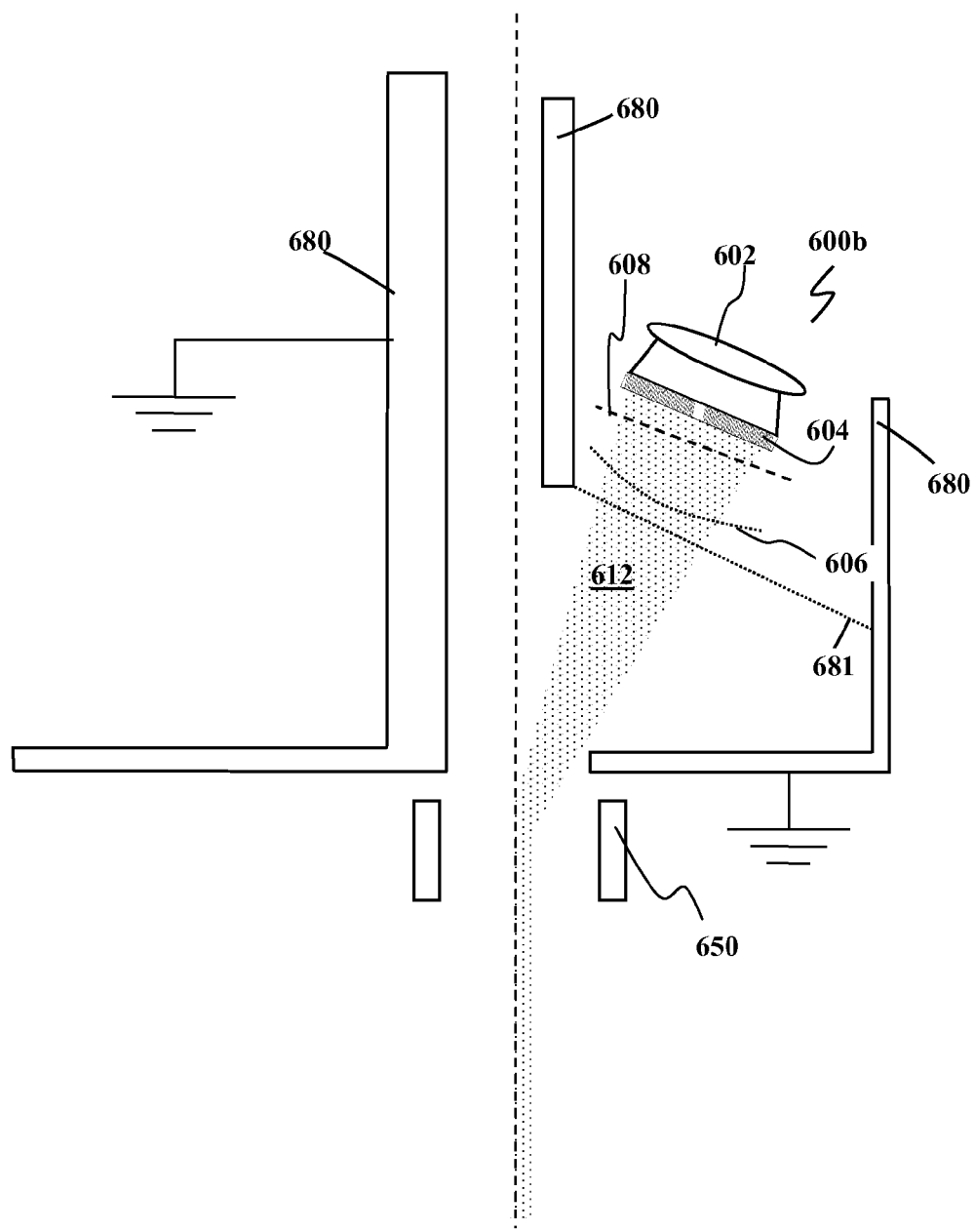
FIG. 7 is a schematic diagram of a flood gun portion of an electron beam imaging apparatus according to an aspect of the present disclosure.
Figure 8:
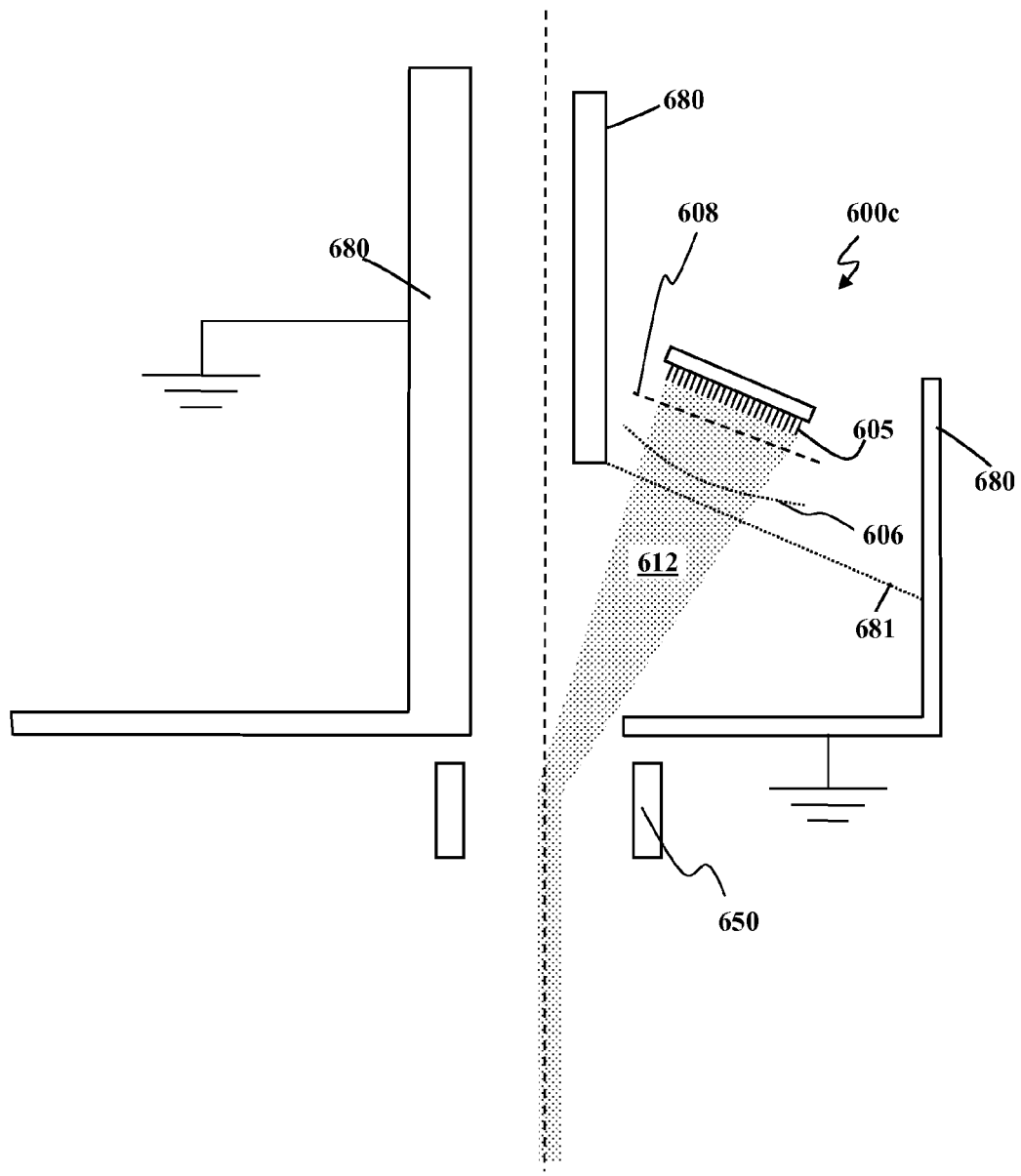
FIG. 8 is a schematic diagram of a flood gun portion of an electron beam imaging apparatus according to an aspect of the present disclosure.

Aspects of the present disclosure are not limited to implementations in which the flood beam source is coaxial with the primary beam source, as in FIG. 1. Many other possible configurations are within the scope of aspects of the present disclosure. For example, FIG. 5 is a schematic diagram of an apparatus according to an aspect of the present disclosure. The apparatus of FIG. 5 is similar to the apparatus of FIG. 1, except for the location of the flood gun. The flood gun 200 of FIG. 1 is provided along the axis of the primary beam 106 while the flood gun 600 is provided off the axis of the primary beam. The flood gun 600 may be a conventional flood gun 600a as shown in FIG. 6, a flood gun 600b having a MCP source as shown in FIG. 7 or a flood gun 600c having nanotube array emitters as shown in FIG. 8. As in the apparatus 100 of FIG. 1, the primary electron gun 104, condensing lenses 108, scanning coils 110, objective lens 112, stage 115, detector 116, flood gun 600, and deflector 650 may be operably coupled to a controller 120. The controller may include a special purpose computer or a general purpose computer configured to operate as a special purpose computer upon execution of code instructions 122, which may be stored in a computer memory or other non-transitory computer readable medium.

Aspects of the present disclosure include implementations in which the flood beam source is not coaxial with the primary beam but the flood beam and primary beam are at least partly coaxial. For example, FIG. 6 illustrates an implementation in which the beam from an off-axis conventional flood gun 600a may be deflected to be coaxial with the primary beam proximate the sample. Such an implementation may be included in an apparatus 500 of FIG. 5. In this implementation, the primary beam is shielded from the flood high voltage by a grounding device, including grounding structures 680 and a ground mesh 681. Additionally, a deflector 650 is included in apparatus 500 so as to steer the flood beam 612 toward the axis of the primary beam 106. In one embodiment, the deflector 650 may be conventional electrostatic deflectors. In another embodiment, the deflector 650 may be a Wien filter.

Specifically, a Wien filter provides a E×B field (e.g., one in which electric and magnetic fields are perpendicular to each other and to the primary beam's path exert oppositely directed forces on the primary beam. The magnitude of the magnetic force depends on strength of the magnetic field and the speed of the particles in the primary beam but the magnitude of the electric force depends only on the strength of the electric field. The Wien filter is normally calibrated to allow primary image beam 106 to pass straight through, while secondary electrons, which travel in the opposite direction will be deflected by the Wein to the detector 116. To fast switch the flood beam 612 on axis, the electric field of the Wien filter can be reversed by switching the polarity of the voltages applied to the field plates. This will cause the flood beam 612 to be steered onto the optical axis. Secondary electrons resulting from interaction between the flood beam 612 and the sample will not be deflected toward the detector.

FIG. 7 illustrates an alternative flood gun 600b that may be included in an apparatus 500 of FIG. 5. The electron source of flood gun 600b includes an initiating radiation source 602, a micro-channel plate (MCP) 604 and an extractor grid (not shown). The initiating radiation source is configured to initiate generation of charged particles by the MCP plate. The initiating radiation source 602 may be a light source of appropriate wavelength for the photo cathode of the MCP. By way of example and not by way of limitation, the initiation radiation source 602 includes an ultraviolet light emitting diode (LED) or a laser. The secondary electrons from the interaction between the radiation and the MCP are then extracted by the extractor grid. An on-axis mesh lens 606 may be included to focus the charged particles extracted by the extractor grid and thereby forming a flood beam of charged particles. The MCP 604 is configured to be turned on and off rapidly by, e.g., high speed voltage supplies. A blanking electrode/mesh 608 may be provided between the MCP 604 and the lens 606 for disabling the flood gun.

FIG. 8 illustrates another alternative flood gun 600c that may be included in an apparatus 500 of FIG. 5. The electron source of flood gun 600c includes a nanotube array emitter 605, and an extractor grid 608 may be provided between the emitter 605 and an on-axis mesh lens 606. The nanotube array emitter generates electrons by field emission when a voltage is applied to an array of nanotubes. Due to the small diameter of the nanotubes (e.g., of order a few nanometers or less), a high electric field exists at the tips of the nanotubes when the voltage is applied. The electrons emitted from the nanotubes by field emission are extracted by the extractor grid. A voltage applied to the mesh lens 606 may be configured to focus the charged particles extracted by the extractor grid 608 and thereby form a flood beam. The extractor grid 608 may operate as a blanking electrode/mesh 608 to disable current from the flood gun 600c. Furthermore, the high voltage applied to the flood gun 600c to accelerate the flood electrons may be shut down when the flood gun is not in operation. Doing so avoids the need to shield the primary beam. The power supply that provides voltage between the extractor grid 608 and the emitter 605 may be high switching speed voltage supplies configured to be turned on and off rapidly, e.g., at greater than 1 Hz, more preferably greater than 10 Hz, still more preferably at greater than 100 Hz and even more preferably, greater than 1000 Hz.

Figure 9:
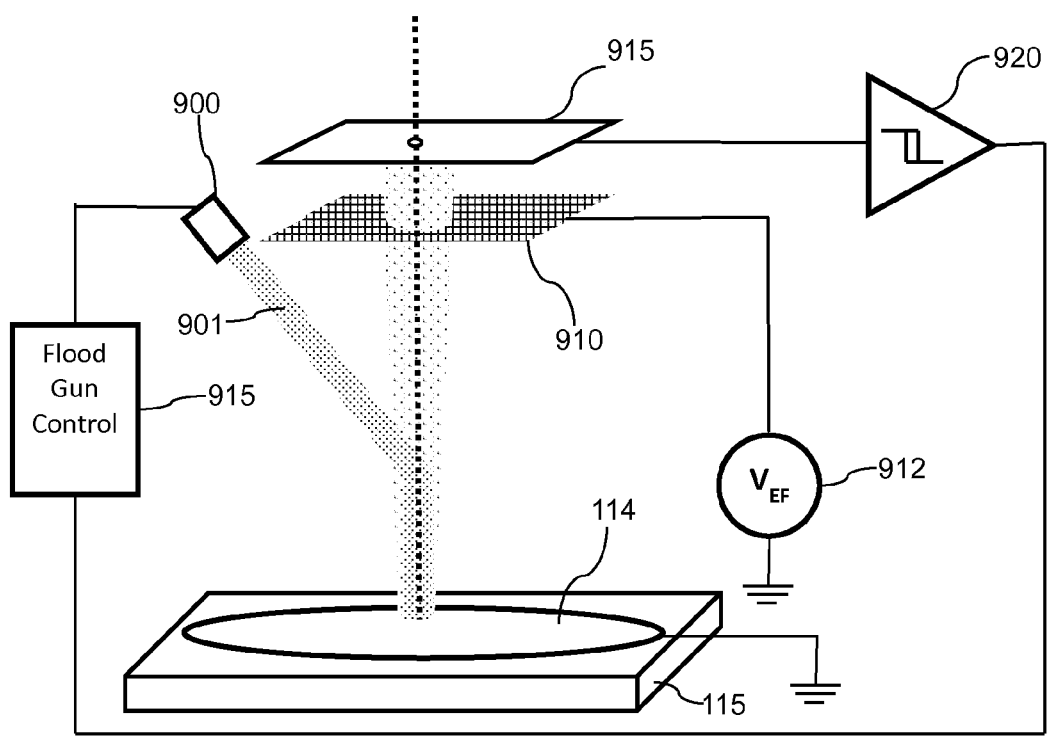
FIG. 9 is a schematic diagram illustrating an example of closed loop operation of a flood gun using an energy filter and secondary detector with a trigger circuit to terminate flooding according to an aspect of the present disclosure.

According to an aspect of the present disclosure, an electron beam imaging system having a flood gun may operate in an in-situ closed-loop flood mode to terminate flooding. Specifically, as illustrated with respect to FIG. 9, a system may have a flood gun 900, flood gun controller 905, a flood detector energy filter 910, a flood detector 915, and a trigger circuit 920 connected to the flood detector 915 and the flood gun controller 905.

The flood gun 900 may be any type of flood gun described herein or a conventional flood gun. The flood gun 900 may be configured so that part of the flood beam 901 is coaxial with a primary beam 106 for a charged particle beam imaging system (e.g., a scanning electron microscope) over a portion of the primary beam path proximate a sample 114. A deflector (not shown), e.g., a Wien filter or electrostatic deflector plates, may steer the flood beam 901 into coaxial alignment with the primary beam 106 proximate the sample 114. The flood detector is configured to detect secondary electrons 903 and backscattered electrons from the sample 114 due to the flood beam 901. The imaging system may include a separate detector (not shown) to detect secondary electrons emitted from the sample during imaging.

The flood detector energy filter 910 may be a simple grid placed between the sample 114 and the flood detector 915. A voltage from a power supply 912 is applied to the grid repels electrons having a total energy less than some energy that depends on the grid voltage. The grid may have a small aperture that allows the primary beam 106 a clear path to pass through the energy filter 910 unimpeded during imaging operation.

The illustrated system may operate as follows. The primary beam 106 is switched off prior to flooding. The flood detector energy filter 910 is set to a voltage corresponding to a desired surface charge voltage added to the bias voltage applied to the sample wafer bias(WB (if any) For example if the desired surface charge voltage is +20V, a voltage of WB+20V would be applied to the energy filter 910. The controller 905 may trigger the flood gun 900 to begin an in-situ flood pulse. As the flood pulse begins the flood beam 901 charges the sample and the sample voltage begins to change as a result of the charging. The sample voltage could rise or fall but for the purposes of example, consider a case where the sample voltage rises. As the sample voltage rises secondary electrons and backscattered electrons leave the sample 114 with progressively lower total energy.

When the surface charge voltage reaches the desired value (e.g., +20V in this example) the secondary electron signal at the flood detector 915 begins to get cutoff by the energy filter 910. The energy filter 910 does not need to be particularly accurate so long as it is sufficiently precise. The trigger circuit 920 detects the drop in signal from the flood detector and triggers the flood gun controller 905 to end to the flood pulse.

If the flood beam current is sufficiently large, the secondary electron and backscattered electron yield from the sample during flooding may be larger than 100 microamps (μA). Even of the flood detector collects only a portion the secondary and backscattered electrons this should still be sufficient for the flood detector signal to have an adequate signal to noise ratio (SNR) with little gain.

Operation in an in-situ closed-loop mode allows for very fast flooding. If flooding can be done sufficiently fast, e.g., much less than 1 μs, it may be possible to start and finish flooding the sample as the primary beam (or beam steering voltage/current, if the beam is turned off) flies back across the imaged portion of the sample at the end of a line of an imaging scan with the primary beam in the x-direction before the primary beam begins the next line scan of the image.

Figure 10A:
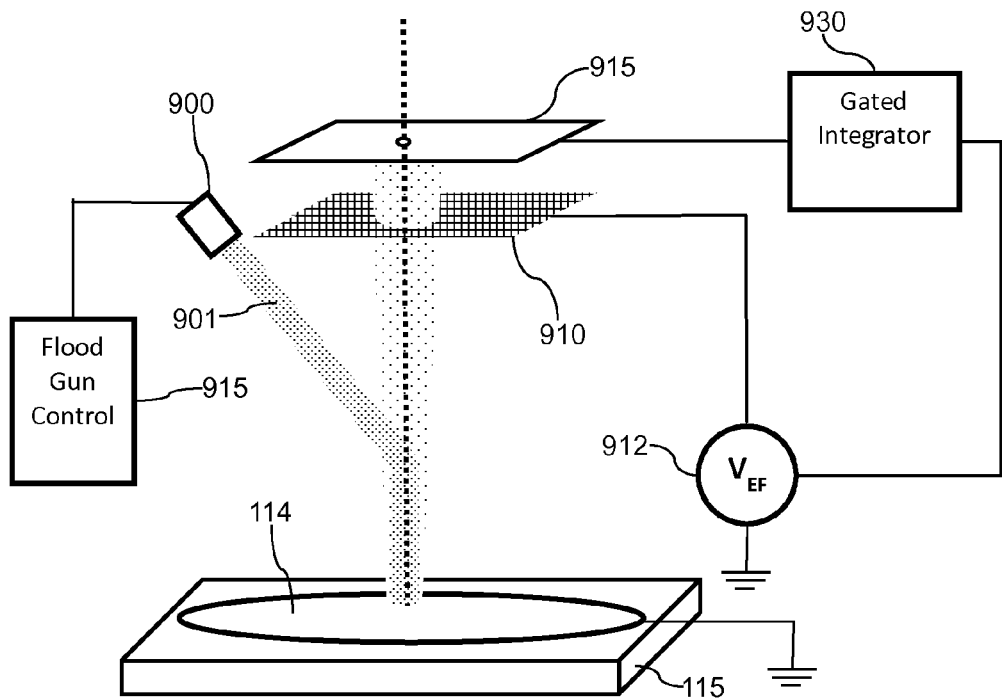
FIG. 10A is a schematic diagram illustrating an example of closed loop operation of a flood gun using an energy filter and secondary detector with a gated integrator to measure rate of voltage change during flooding according to an aspect of the present disclosure.

According to an aspect of the present disclosure, an electron beam imaging system having a flood gun may operate in an alternative in-situ closed-loop to measure the voltage applied to the energy filter 910 while flooding. By reading back the value of the energy filter voltage as the sample is flooded, one can track the surface potential value and rate of change of surface voltage. This can be used to identify large area defects, for instance, a contact array with excessive leakage. FIG. 10A depicts an apparatus that is similar to the apparatus of FIG. 9. However, instead of a trigger circuit connected to flood detector 915 and the flood gun controller 915, a gated integrator 930 is coupled between the flood detector and the energy filter power supply 912. The gated integrator 930 integrates a signal input (e.g., a current) from the flood detector after a defined waiting time (trigger delay) over a specified period of time (gate width) and then average over multiple integration results (samples).

In operation, the energy filter 910 is biased to some voltage e.g., −5V, with respect to the surface potential of the sample. This causes the energy filter to "cut off", or reject, all secondary electrons (SE) with less than 5 eV of initial energy. In this example only electrons with greater than 5 eV energy would make it to the detector 915. Consequently, the detector current to the gated integrator 930 is a value corresponding to 5 eV and above electrons. The gated integrator includes a summing junction that subtracts a DC current set to the expected value of the detector current. The output of the summing junction feeds the integrator. When the detector current equals the reference current no voltage is integrated. When the detector current is different from the reference current, voltage is added or subtracted. The output of the integrator is added to the energy filter voltage. If, e.g., the flood beam 901 charges the sample 114 positively, the detector current will begin to decrease causing a mismatch with the reference current and the integrator 930 will produce a digital output that adjusts the energy filter voltage power supply 912 to follow the surface potential of the sample 114. This signal may be read by a system controller (not shown) to track the surface potential.

Figure 10B:
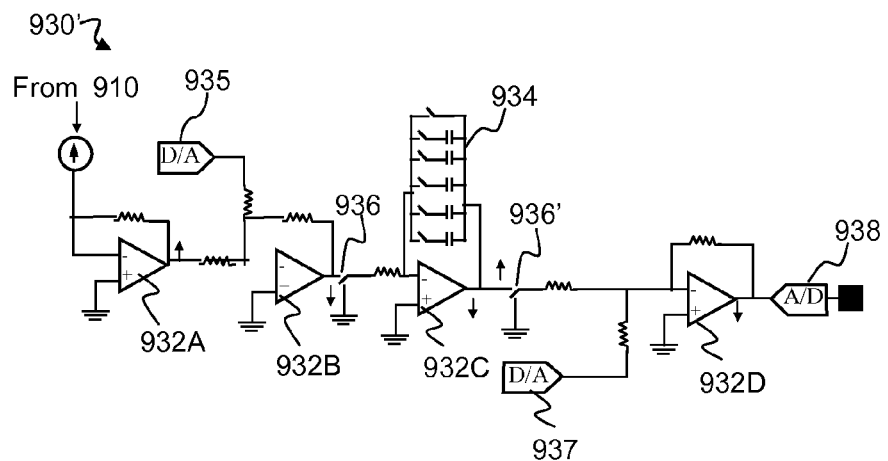
FIG. 10B is a schematic diagram illustrating an example of a gated integrator that may be used in conjunction with the apparatus illustrated in FIG. 10A.

By way of example, and not by way of limitation, FIG. 10B depicts a possible configuration of a gated integrator 930' that may be used in the apparatus of FIG. 10A. The integrator 932' includes first, second, third, and fourth cascaded amplifiers 932A, 932B, 932C, 932D, and a capacitor bank 934. A current signal from the detector 915 can be coupled to an input of the first amplifier 932A. A first digital to analog (D/A) converter 935 coupled between an output of the first amplifier 932A and an input of the second amplifier 932B is set to null the expected average detector current. A gate switch 936 between the output of the second amplifier 932B and an input of the third amplifier may be used to gate the integrator when the flood beam 901 is blanked, e.g., during flyback of the sample 114. The capacitor bank 934 includes multiple different switched capacitors that are coupled in parallel between an input and an output of the third amplifier 932C. Each capacitor in the capacitor bank 934 has a corresponding switch. By selectively opening or closing the switches a particular combination of capacitors can be used to set the integration time constant for different scan rates. Selectively opening and closing the switches may also be used to reset the integrator. A cutout switch 936' between the capacitor bank 934 and input to the fourth amplifier 932D may be used to cut out the integrator. A second D/A converter 937 is coupled to an input of the fourth amplifier 932D to set the input to the cutoff voltage of the energy filter 910. The output of the fourth amplifier 932D is coupled to an analog to digital (A/D) converter 938, which provides a digital signal to the energy filter power supply 912 that adjusts the voltage provided to the energy filter 910.

The rate of change of the energy filter voltage may be monitored and compared to a stored reference to determine if an area defect exists on the wafer. Alternatively, the flood beam may charge an area of the sample to saturation and the corresponding energy filter voltage may be compared to a reference to determine if an area defect exists on the wafer.

Aspects of the present disclosure facilitate in situ charge control on a sample in conjunction with charged particle beam inspection of the sample. By supplying a high current density electron dose to a sample charge may be controlled without requiring removal of the sample from the inspection beam or otherwise requiring inspection beam operation to be interrupted for long periods of time. These advantages allow for greater throughput of samples, e.g., semiconductor wafers, in a production environment.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An apparatus, comprising:
   a first device configured to charge a sample in a first mode, wherein the first device includes an electron source configured to provide a flood beam of charged particles to a first area of the sample; and
   a second device configured to generate a primary beam of electrons and characterize an interaction between the primary beam and a second area of the sample within the first area in a second mode, wherein the apparatus is configured to switch from the first mode to the second mode in less than 1 second.

2. The apparatus of claim 1, wherein the apparatus is configured to switch from the first mode to the second mode in less than 0.1 second.

3. The apparatus of claim 1, wherein the apparatus is configured to switch from the first mode to the second mode in less than 0.01 second.

4. The apparatus of claim 1, wherein the apparatus is configured to switch from the first mode to the second mode in less than 1 millisecond.

5. The apparatus of claim 1, wherein the apparatus is configured to switch from the first mode to the second mode in less than 1 microsecond.

6. The apparatus of claim 1, wherein the apparatus is configured to flood the sample as the primary beam flies back at the end of a line of a scan of a portion of the sample by the primary beam.

7. The apparatus of claim 1, wherein the first device is a flood gun.

8. The apparatus of claim 1, wherein the second device is a scanning electron microscope (SEM), a critical dimension scanning electron microscope (CD-SEM) or an e-beam inspection system, an e-beam review system or an e-beam lithography system.

9. The apparatus of claim 1 wherein the electron source is a thermionic source, a field emission source or a photon emission source.

10. The apparatus of claim 1, wherein the electron source includes an initiating radiation source, a micro-channel plate and an extractor, the initiating radiation source being configured to initiate generation of charged particles by the micro-channel plate, and the extractor being configured to extract the charged particles and form the flood beam.

11. The apparatus of claim 10, wherein the initiating radiation source includes a light emitting diode (LED) or laser.

12. The apparatus of claim 10, wherein a beam-defining aperture for the second device is between the micro-channel plate and the sample.

13. The apparatus of claim 10, wherein the micro-channel plate is provided between a beam-defining aperture for the second device and the sample.

14. The apparatus of claim 1 wherein the electron source includes an initiating radiation source, a nanotube array emitter and an extractor, the initiating radiation source being configured to initiate generation of charged particles by the nanotube array emitter, and the extractor being configured to extract the charged particles and form the flood beam.

15. The apparatus of claim 1, wherein the first device further comprises a blanking electrode configured to turn off the first device.

16. The apparatus of claim 1, wherein at least a portion of the flood beam is coaxial with the primary beam.

17. The apparatus of claim 16, further comprising a deflector to deflect the flood beam to be coaxial with the primary beam.

18. The apparatus of claim 17, wherein the deflector is a Wien filter configured to deflect the flood beam to be coaxial with the primary beam by switching an electric field of the Wien filter.

19. The apparatus of claim 1, wherein the first device is configured to provide the flood beam coaxially with the primary beam.

20. The apparatus of claim 1, further comprising a detector configured to detect secondary electrons and/or backscattered electrons from the sample.

21. The apparatus of claim 20, further comprising an energy filter configured to cut off secondary electrons and/or backscattered electrons from the sample having less than a selected total energy from reaching the detector.

22. The apparatus of claim 21, further comprising a trigger circuit coupled to the detector and a controller that controls the first device, wherein the trigger circuit is configured to detect a drop in signal from the detector and trigger the controller to turn off the flood beam.

23. The apparatus of claim 21, further comprising a gated integrator coupled to the detector and a voltage source that supplies voltage to the energy filter, wherein the integrator is configured to integrate a signal from the detector when the signal is different from a reference signal and provide a control signal to the voltage supply that causes the voltage to the energy filter to adjust as a surface voltage of the sample changes.

24. A method, comprising:
    imaging a first area of a sample within a first region of the sample with a primary beam of electrons from a first device;
    charging the first area of a sample with a flood beam of charged particles from a second device, wherein the second device includes an electron source; and
    imaging a second area of the sample within the first area with the primary beam of electrons from the first device, wherein a time between ending imaging of the first area and beginning imaging of the second area is less than one second.

25. The method of claim 24, wherein a time between ending imaging of the first area and beginning imaging of the second area is less than 0.1 second.

26. The method of claim 24, wherein a time between ending imaging of the first area and beginning imaging of the second area is less than 0.01 second.

27. The method of claim 24, wherein a time between ending imaging of the first area and beginning imaging of the second area is less than 1 millisecond.

28. The method of claim 24, wherein charging the first area includes charging an area of about 1 mm in diameter with a flood current at about 1 mA for about 1 microsecond to 1 ms.

29. The method of claim 24, wherein the electron source is a thermionic source, a field emission source or a photon emission source.

30. The method of claim 24, wherein the electron source includes an initiating radiation source, a micro-channel plate and an extractor, the initiating radiation source being configured to initiate generation of charged particles by the micro-channel plate, and the extractor being configured to extract the charged particles and form the flood beam.

31. The method of claim 24, wherein the first device is configured to provide the flood beam coaxially with the primary beam.

32. The method of claim 24, wherein the first and second areas are part of a swath across a width of the sample and the charging takes place as the swath is being imaged.

33. The method of claim 24, wherein charging the first area of the sample takes place as the primary beam flies back at the end of a line of a scan of a portion of the sample by the primary beam.

* * * * *